United States Patent [19]

Koizumi et al.

[11] Patent Number: 5,326,593
[45] Date of Patent: Jul. 5, 1994

[54] SURFACE ROUGHENING OF RESIN MOLDED ARTICLES FOR METALLIZING

[75] Inventors: Tomoyoshi Koizumi; Yukio Ichikawa, both of Fukushima, Japan

[73] Assignee: Kureha Kagaku Kogyo Kabushiki Kaisha, Tokyo, Japan

[21] Appl. No.: 897,057

[22] Filed: Jun. 11, 1992

[30] Foreign Application Priority Data

Jun. 14, 1991 [JP] Japan ................... 3-168957

[51] Int. Cl.$^5$ .............................................. B05D 3/10
[52] U.S. Cl. ............................. 427/307; 264/129; 264/232; 264/344; 427/322
[58] Field of Search ............ 264/232, 340, 344, 341, 264/129, 136, 343; 156/645; 427/304, 307, 322

[56] References Cited

U.S. PATENT DOCUMENTS

| | | | |
|---|---|---|---|
| 4,522,875 | 6/1985 | Still, Jr. et al. | 428/419 |
| 4,532,015 | 7/1985 | Boultinghouse et al. | 427/98 |
| 4,590,104 | 5/1986 | Zeiner | 427/389.7 |
| 4,814,224 | 3/1989 | Geibel et al. | 428/419 |
| 4,883,702 | 11/1989 | Sato et al. | 428/419 |
| 4,921,558 | 5/1990 | Johnson et al. | 264/136 |
| 4,937,032 | 6/1990 | Krone et al. | 264/255 |
| 5,028,461 | 7/1991 | Nakamichi | 426/113 |
| 5,134,190 | 7/1992 | Kosaka | 524/444 |

FOREIGN PATENT DOCUMENTS 0326918  1/1989  European Pat. Off. .

OTHER PUBLICATIONS

Database WPIL Week 2690, Derwent Publications Ltd., London, GB; AN 90-198869 & JP-A-2 133 428 (Toray Ind. Inc.) May 22, 1990.

Primary Examiner—Jay H. Woo
Assistant Examiner—Duane S. Smith
Attorney, Agent, or Firm—Sughrue, Mion, Zinn, Macpeak & Seas

[57] ABSTRACT

A method for roughening the surface of a resin molded article to make it susceptible to metallizing is disclosed, including contacting a resin molded article at least the surface portion of which to be roughened mainly includes a block copolymer including 100 parts by weight of a polyarylene sulfide component block and from 100 to 200 parts by weight of a polyarylene sulfide ketone component block with a solvent capable of dissolving a polyarylene sulfide ketone more than a polyarylene sulfide.

8 Claims, No Drawings

SURFACE ROUGHENING OF RESIN MOLDED ARTICLES FOR METALLIZING

FIELD OF THE INVENTION

This invention relates to a method for roughening the surface of a polyarylene sulfide resin (hereinafter abbreviated as PAS) molded article to render the same susceptible to metallizing.

BACKGROUND OF THE INVENTION

With the recent demands for size and weight reductions of parts, metallizing of PAS molded articles is acquiring importance in the fields of substitutes for metals, printed circuit boards, condensers, etc.

There have been proposed many methods for surface roughening preceding metallizing of PAS molded articles, but the particular method according to the present invention is unknown.

SUMMARY OF THE INVENTION

An object of the present invention is to provide a novel method for surface roughening of PAS molded articles.

The present invention relates to a method for roughening the surface of a resin molded article to make it susceptible to metallizing, which comprises contacting a resin molded article at least the surface portion of which to be roughened mainly comprises a block copolymer comprising 100 parts by weight of a PAS block and from 100 to 200 parts by weight of a polyarylene sulfide ketone (hereinafter abbreviated as PASK) block with a solvent capable of dissolving PASK more than PAS.

DETAILED DESCRIPTION OF THE INVENTION

The molded article to be roughened and metallized should have a PAS-PASK block copolymer resin or a composition containing at least 50% by weight, preferably at least 70% by weight, and more preferably at least 90% by weight, of the PAS-PASK block copolymer on at least the surface portion thereof to be roughened and metallized. The part of the molded article which is not to be metallized does not need to comprise the PAS-PASK block copolymer or a composition thereof. For example, the inner part of the molded article may comprise a different material(s), such as a glass mat.

The block copolymer which can be used in the present invention is a block copolymer essentially comprising a PAS component block and a PASK component block. The block copolymer preferably comprises only the PAS and PASK components but may contain other component blocks.

Taking —Ar—S— (wherein Ar represents an arylene group) as unit mol, the terminology "PAS component block" as used herein means a block containing not less than 50 unit mol %, preferably not less than 70 unit mol %, and more preferably not less than 90 unit mol %, of the unit in a block. The arylene group preferably includes a phenylene group, and particularly a p-phenylene group. Other comonomer units in the case of a copolymer block include an m-phenylene sulfide unit, a diphenyl ether sulfide unit, a biphenylene sulfide unit, and a 2,6-naphthylene sulfide unit.

Taking —Ar—CO—Ar—S— (wherein Ar is as defined above) as unit mol, the terminology "PASK component block" as used herein means a block containing not less than 50 unit mol %, preferably not less than 70 unit mol %, and more preferably not less than 90 unit mol %, of the unit in a block. The arylene group preferably includes a phenylene group, and particularly a p-phenylene group. Examples of usable comonomer units in the case of a copolymer block are the same as in the PAS component block.

In the PAS-PASK block copolymer, the two component blocks, taken as A and B, are alternately arranged to have an arbitrary block structure, such as an -A-B-A- structure and an —A—B-structure.

The block copolymer comprises from 100 to 200 parts, preferably from 120 to 180 parts, and more preferably from 130 to 170 parts, by weight of a PASK component block per 100 parts by weight of a PAS component block. If the PASK component block is less than 100 parts, roughening cannot be sufficiently carried out. If it exceeds 200 parts, roughening becomes improper. In either case, adhesion to a metallic deposit is reduced.

A process for preparing the PAS-PASK block copolymer is not particularly restricted. For example, the process disclosed in Japanese Patent Application No. Hei-3-67554 as briefly explained below is suitably adopted. For the detail, refer to the publication.

A first process consists of a first step in which an organic amide solvent containing an alkali metal sulfide and a dihalo-aromatic compound mainly comprising a dihalobenzene is heated in the presence of a prescribed amount of water to synthesize a PAS oligomer having a repeating unit —Ar—S— as a main component and a thiolate group at the terminal thereof; and a second step in which the resulting oligomer is mixed with a dihaloaromatic compound mainly comprising 4,4'-dichlorobenzophenone and/or 4,4'-dibromobenzophenone, an alkali metal sulfide, an organic amide solvent, and a prescribed amount of water, and the mixture is heated to synthesize a PASK component mainly comprising a repeating unit —Ar—CO—Ar—S— and to obtain a block copolymer simultaneously.

A second process comprises a first step in which an organic amide solvent containing an alkali metal sulfide and a dihaloaromatic compound mainly comprising a dihalobenzene is heated in the presence of a water content to synthesize a PAS oligomer having a repeating unit —Ar—S— as a main component and a thiolate group at the terminal thereof; a second step in which an organic amide solvent containing an alkali metal sulfide and a dihalo-aromatic compound mainly comprising 4,4'-dichlorobenzophenone and/or 4,4'-dibromobenzophenone is heated in the presence of a water content to synthesize a PASK oligomer mainly comprising a repeating unit —Ar—CO—Ar—S—; and a third step in which the PAS oligomer and PASK oligomer prepared above are allowed to react in the presence or absence of water.

Methods of molding the PAS-PASK block copolymer or a composition thereof are not particularly limited, and molding techniques generally employed for PAS, such as injection molding, extrusion, compression molding, blow molding, and the like, can be used.

The thus obtained molded article is preferably subjected to degreasing before contact with a solvent. Degreasing is usually carried out by dipping the molded article in an alkali rinsing solution at pH 10 to 12 preferably while applying ultrasonic waves, followed by washing with water and drying.

The degreased molded article is then brought into contact with a solvent capable of dissolving PASK consisting of a PASK component block more than PAS consisting of a PAS component block. Such a solvent includes 90% by weight or higher, and preferably 95% by weight or higher concentrated sulfuric acid, methanesulfonic acid, trifluoromethanesulfonic acid, and trichloromethanesulfonic acid.

The contact between the surface to be roughened and the solvent is preferably effected by dipping. The contact may be effected by spraying or coating of the solvent. Dipping is preferably performed with stirring by means of, for example, an ultrasonic vibration apparatus. The contact is conducted at room temperature or, if desired, under heating. The contact time is selected appropriately depending on various conditions, such as the PAS to PASK ratio of the block copolymer on the surface portion, the kind of the solvent used, the stirring condition, and so on.

The roughened surface is usually washed with water and dried before metallizing. Metallizing can be carried out in a known manner. For example, the surface is treated with a strong acid solution containing an oxidizing agent, followed by electroless plating or a combination of electroless plating and electroplating, sputtering, or vacuum deposition. The effects of the present invention are particularly significant in metallizing by electroless plating or a combination of electroless plating and electroplating.

The present invention is now illustrated in greater detail with reference to Examples, but it should be understood that the present invention is not construed as being limited thereto. All the parts, percents, and ratios are given by weight unless otherwise indicated.

In Examples, plate adhesion of the plated (metallized) resin article was evaluated according to the following test method.

PLATE ADHESION

Plate adhesion was tested by peel test using an adhesive cellophane tape substantially according to JIS K5400. The deposited metal film of a plated molded article is crosshatched with a cutter to make 100 1-by-1 mm squares, and an adhesive cellophane tape is sufficiently adhered to the squares to an adhesion length of about 50 mm. Two minutes later, one end of the adhesive tape is rapidly peeled at a peel angle of 90°. The condition of the metal film remaining on the resin molded article is observed and rated according to the following standards.

10 ... Every scratch is narrow and smooth, and none of the squares undergoes peeling even at the corners.

8 ... The total peeling area is within 5% of the total square area.

6 ... The total peeling area is from 5 to 15% of the total square area.

4 ... The total peeling area is from 15 to 35% of the total square area.

2 ... The total peeling area is from 35 to 65% of the total square area.

0 ... The total peeling area is 65% or more of the total square area.

EXAMPLE 1

Synthesis of Polyphenylene Sulfide Oligomer

In a titanium-lined polymerization vessel were charged 170.0 kg of hydrated sodium sulfide (water content: 53.91%) and 375 kg of N-methylpyrrolidone. The mixture was heated up to 185° C. in a nitrogen atmosphere to distill off 65.6 kg of water and 29.6 mol of hydrogen sulfide. Then, 114.2 kg of p-dichlorobenzene and 110 kg of N-methylpyrrolidone were added to the residue, and a polymerization reaction was conducted at 220° C. for 4 hours and then at 230° C. for 4 hours to obtain a slurry containing a polyphenylene sulfide (hereinafter abbreviated as PPS) oligomer.

Synthesis of Polyphenylene Sulfide Ketone Oligomer

In a separate titanium-lined polymerization vessel were charged 121.4 kg of 4,4'-dichlorobenzophenone (a product of Ihara Chemical Co., Ltd.), 51.2 kg of hydrated sodium sulfide (water content: 53.91%), 20.4 kg of water, and 532 kg of N-methylpyrrolidone. After displacing the atmosphere with nitrogen, the mixture was kept at 220° C. for 1 hour to prepare a slurry containing a polyphenylene sulfide ketone (hereinafter abbreviated as PPSK) oligomer.

Synthesis of Block Copolymer

The whole amount of the PPS oligomer-containing slurry (slurry temperature: 180° C.) was added to the whole amount of the PPSK oligomer-containing slurry (slurry temperature: 180° C.), and 109 kg of water was further added thereto, followed by mixing.

The temperature of the mixture was once elevated to 274° C. and immediately thereafter dropped to 240° C. Then, 12.7 kg of 4,4'-dichlorobenzophenone and 30 kg of N-methylpyrrolidone were added thereto, followed by allowing the mixture to react at 240° C. for 30 minutes to conduct an end-group treatment.

The resulting slurry was sieved through a screen having an opening of 150 μm (100 mesh) to obtain polymer particles. The polymer particles were washed with an equivalent amount of N-methylpyrrolidone and again sieved with a screen of the same opening as above. The recovered polymer was washed twice with methanol and then five times with water and dried by means of a paddle drier at 140° C. for 4 hours to obtain a granular polymer. The recovery was about 80%.

DSC analysis and elemental analysis on carbon and sulfur revealed that the resulting polymer was a block copolymer comprising 100 parts of PPS and 125 parts of PPSK and having a crystal melting point of 319° C.

Sixty parts of the resulting block copolymer and 40 parts of glass fibers were mixed and injection molded to prepare a 100 mm long, 10 mm wide and 4 mm thick specimen.

The specimen was dipped in an alkali rinsing liquid ("EXTRAN MA 01" produced by Merck Japan, 10-fold diluted with distilled water) for 5 minutes with ultrasonic vibration for degreasing. The specimen was washed with distilled water for 5 minutes with ultrasonic vibration and dried. The specimen was further dipped in a 98% sulfuric acid solution at room temperature for 10 minutes while applying ultrasonic vibration to conduct surface roughening. Electron microscopic observation revealed that the surface, which had been smooth at a magnification of 5000 before roughening, had a surface roughness of not more than 1 μm.

In 10 ml of a 35% hydrochloric acid aqueous solution were dissolved 0.05 g of $PdCl_2$ and 0.5 g of $SnCl_2$, and 10 ml of water was added thereto. The specimen having a roughened surface was soaked in the thus prepared aqueous solution for 15 minutes while maintaining the solution at 30° C. for surface activation. After washing with distilled water for 5 minutes, the specimen was dipped in an aqueous solution containing 56 g of CuSO$_4$, 1.0 g of NaOH, 5.0 g of NaKC$_4$O$_6$, 1.0 ml of a 40% formaldehyde aqueous solution, and 39 ml of water for 20 minutes at a temperature controlled to 0° C. to conduct copper plating.

As a result of peel test, the plate adhesion was rated "10".

EXAMPLE 2

Synthesis of PPS Oligomer

In a titanium-lined polymerization vessel were charged 165.0 kg of hydrated sodium sulfide (water content: 53.91%) and 350 kg of N-methylpyrrolidone, and distillation was conducted in the same manner as in Example 1. To the residue were added 104.2 kg of p-dichlorobenzene, 2.4 kg of water, and 122.5 kg of N-methylpyrrolidone, and polymerization was conducted in the same manner as in Example 1 to obtain a slurry containing a PPS oligomer.

Synthesis of PPSK Oligomer

A slurry containing PPSK oligomer was prepared in the same manner as in Example 1, except for using 136.01 kg of 4,4'-dichlorobenzophenone, 53.86 kg of hydrated sodium sulfide (water content: 53.91%), 24.7 kg of water, and 595.5 kg of N-methylpyrrolidone.

Synthesis of Block Copolymer:

The whole amounts of the above-prepared two slurries were mixed, and 113.3 kg of water was further added thereto to conduct polymerization. The polymer was subjected to an end-group treatment in the same manner as in Example 1.

As a result of DSC analysis and carbon and sulfur elemental analysis, the resulting polymer was found to be a block copolymer comprising 100 parts of PPS and 154 parts of PPSK and having a crystal melting point of 322° C.

Preparation of a specimen, and surface toughening and plating of the specimen were performed in the same manner as in Example 1. Electron microscopic observation of the specimen after roughening revealed a surface roughness of not more than 1 μm. The plate adhesion of the plated resin molded article was rated "10".

EXAMPLE 3

The same procedure of Example 2 was repeated, except that no glass fiber was used. The surface of the specimen after roughening was observed to have a surface roughness of not more than 1 μm under an electron microscope. The plate adhesion was rated "10".

EXAMPLE 4

The same procedure of Example 1 was repeated, except for replacing concentrated sulfuric acid for toughening with methanesulfonic acid. The surface of the specimen after roughening was observed to have a surface roughness of not more than 1 μm under an electron microscope. The plate adhesion was rated "10".

EXAMPLE 5

Synthesis of PPS Oligomer

In a titanium-lined polymerization vessel were charged 4,800 g of hydrated sodium sulfide (water content: 53.91%) and 9,000 g of N-methylpyrrolidone, and distillation was conducted in the same manner as in Example 1. To the residue were added 3,237 g of p-chlorobenzene and 4,763 g of N-methylpyrrolidone, and polymerization was conducted in the same manner as in Example 1 to obtain a slurry containing a PPS oligomer.

Synthesis of PPSK Oligomer

A slurry containing PPSK oligomer was prepared in the same manner as in Example 1, except for using 1,478 g of 4,4'-dichlorobenzophenone, 754 g of hydrated sodium sulfide (water content: 53.91%), 124 g of water, and 5,888 g of N-methylpyrrolidone.

Synthesis of Block Copolymer 5,623 g of the PPS oligomer-containing slurry (slurry temperature: 180° C.) was added to the whole amount of the PPSK oligomer-containing slurry (slurry temperature: 180° C.), and 1,020 g of water was further added thereto, followed by mixing.

The temperature of the mixture was elevated to 270° C. and then dropped to 240° C. Then, 123 g of 4,4'-dichlorobenzophenone and 698 g of N-methylpyrrolidone were added thereto, followed by allowing the mixture to react at 240° C. for 0.2 hour to conduct an end-group treatment.

As a result of DSC analysis and carbon and sulfur elemental analysis, the resulting polymer was found to be a block copolymer comprising 100 parts of PPS and 186 parts of PPSK and having a crystal melting point of 323° C.

This polymer was subjected to high-temperature pressing at 380° C. and then cooled to obtain a sheet-like molded article having a thickness of 500 μm. This sheet was heat treated at 180° C. for 30 minutes to effect crystallization.

Plating of the crystallized sheet was conducted in the same manner as in Example 1. As a result, the resulting sheet was observed to have a surface roughness of not more than 1 μm under an electron microscope. The plate adhesion was rated "10".

COMPARATIVE EXAMPLE 1

Synthesis of PPS Oligomer

In a titanium-lined polymerization vessel were charged 220.0 kg of hydrated sodium sulfide (water content: 53.7%) and 412.5 kg of N-methylpyrrolidone. The mixture was gradually heated up to 200° C. in a nitrogen atmosphere to distill off 174.7 kg of an N-methylpyrrolidone solution containing 91.2 kg of water and 26.125 mol of hydrogen sulfide. Then, 161.56 kg of p-dichlorobenzene, 8.456 kg of water, and 310.1 kg of N-methylpyrrolidone were added to the residue, and a polymerization reaction was conducted at 220° C. for 10 hours to obtain a slurry containing a PPS oligomer.

Synthesis of PPSK Oligomer

A PPSK oligomer-containing slurry was prepared in the same manner as in Example 1, except for using 62.8 kg of 4,4'-dichlorobenzophenone, 10.93 kg of hydrated sodium sulfide (water content: 53.91%), 12.1 kg of water, and 275.3 kg of N-methylpyrrolidone.

Synthesis of Block Copolymer

To the PPSK oligomer-containing slurry as prepared above (slurry temperature: 220° C.) was added 627 kg of the PPS oligomer-containing slurry (slurry temperature: 220° C.), and 78.8 kg of water was further added thereto. The mixture was allowed to react at 260° C. for 2 hours. After dropping the temperature to 240° C., 7.5 kg of 4,4'-dichlorobenzophenone and 34.4 kg of N-methylpyrrolidone were added thereto, followed by allowing the mixture to react at 240° C. for 0.2 hour to conduct an end-group treatment.

DSC analysis and carbon and sulfur elemental analysis revealed that the resulting polymer was a block copolymer comprising 100 parts of PPS and 65 parts of PPSK and having a crystal melting points of 301° C. and 324° C.

Preparation of a specimen and surface roughening and plating of the specimen were performed in the same manner as in Example 1. The surface of the specimen after roughening was observed under an electron microscope, but surface unevennesses of 1 μm or less were not formed. The plate adhesion of the plated resin molded article was rated "0".

COMPARATIVE EXAMPLE 2

Synthesis of PPSK Oligomer

A PPSK oligomer-containing slurry was prepared in the same manner as in Example 1, except for using 1,027 g of 4,4'-dichlorobenzophenone, 3,001 g of hydrated sodium sulfide (water content: 53.91%), 206 g of water, and 4,091 g of N-methylpyrrolidone.

Synthesis of Block Copolymer

To the whole amount of the PPSK oligomer-containing slurry as prepared above (slurry temperature: 180° C.) was added 8,868 g of the PPS oligomer-containing slurry as prepared in Example 5 (slurry temperature: 180° C.), and 1,141 g of water was further added thereto, followed by mixing.

The temperature of the mixture was elevated to 270° C. and then dropped to 240° C. Then, 141 g of 4,4'-dichlorobenzophenone and 802 g of N-methylpyrrolidone were added thereto, followed by allowing the mixture to react at 240° C. for 0.2 hour to conduct an end-group treatment.

As a result of DSC analysis and carbon and sulfur elemental analysis, the resulting polymer was found to be a block copolymer comprising 100 parts of PPS and 82 parts of PPSK and having a crystal melting point of 295° C.

This polymer was subjected to high-temperature pressing at 380° C. and then cooled to obtain a sheet-like molded article having a thickness of 500 μm. This sheet was heat treated at 180° C. for 30 minutes to effect crystallization.

Plating of the crystallized sheet was conducted in the same manner as in Example 1. Electron microscopic observation of the resulting sheet revealed that surface unevennesses of from 1 to several μm were formed. The plate adhesion was rated "6".

COMPARATIVE EXAMPLE 3

Synthesis of PPSK Oligomer

A PPSK oligomer-containing slurry was prepared in the same manner as in Example 1, except for using 1,591 g of 4,4'-dichlorobenzophenone, 867 g of hydrated sodium sulfide (water content: 53.91%), 103 g of water, and 6,335 g of N-methylpyrrolidone.

Synthesis of Block Copolymer

To the whole amount of the PPSK oligomer-containing slurry as prepared above (slurry temperature: 180° C.) was added 4,815 g of the PPS oligomer-containing slurry as prepared in Example 5 (slurry temperature: 180° C.), and 990 g of water was further added thereto, followed by mixing.

The temperature of the mixture was elevated to 270° C. and then dropped to 240° C. Then, 118 g of 4,4'-dichlorobenzophenone and 673 g of N-methylpyrrolidone were added thereto, followed by allowing the mixture to react at 240° C. for 0.2 hour to conduct an end-group treatment.

As a result of DSC analysis and carbon and sulfur elemental analysis, the resulting polymer was found to be a block copolymer comprising 100 parts of PPS and 230 parts of PPSK and having a crystal melting point of 328° C.

This polymer was subjected to high-temperature pressing at 380° C. and then cooled to obtain a sheet-like molded article having a thickness of 500 μm. This sheet was heat treated at 180° C. for 30 minutes to effect crystallization.

Plating of the crystallized sheet was conducted in the same manner as in Example 1. Electron microscopic observation of the resulting sheet revealed that surface unevennesses of 1 μm or less were not formed. The plate adhesion was rated "6".

The results of the foregoing Examples and Comparative Examples are shown in Table 1 below.

TABLE 1

| Example No. | Block Copolymer | | Glass Fiber | Solvent | Plate Adhesion |
|---|---|---|---|---|---|
| | PPS | PPSK | | | |
| Ex. 1 | 100 | 125 | 150 | conc. sulfuric acid | 10 |
| Ex. 2 | 100 | 154 | 170 | conc. sulfuric acid | 10 |
| Ex. 3 | 100 | 154 | 0 | conc. sulfuric acid | 10 |
| Ex. 4 | 100 | 125 | 150 | methane-sulfonic acid | 10 |
| Ex. 5 | 100 | 186 | 0 | conc. sulfuric acid | 10 |
| Comp. Ex. 1 | 100 | 65 | 110 | conc. sulfuric acid | 0 |
| Comp. Ex. 2 | 100 | 82 | 0 | conc. sulfuric acid | 6 |

As described and demonstrated above, the method for surface roughening according to the present invention provides a roughened surface excellent in adhesion to a metallic deposit. In addition, having excellent heat resistance, PPSK introduced as a block copolymerization component causes no impairment of heat resistant properties of the PAS resin molded article. Thus, the metallized products obtained by metallizing the surface-roughened resin molded article can be used in many fields of substitutes for metallic parts, printed circuit boards, etc.

While the invention has been described in detail and with reference to specific examples thereof, it will be apparent to one skilled in the art that various changes and modifications can be made therein without departing from the spirit and scope thereof.

What is claimed is:

1. A method for roughening the surface of a resin molded article to make it susceptible to metallizing, which comprises the step of contacting a resin molded article at least the surface portion of which to be roughened mainly comprises a block copolymer comprising 100 parts by weight of a polyarylene sulfide component block and from 100 to 200 parts by weight of a polyarylene sulfide ketone component block with a solvent capable of dissolving a polyarylene sulfide ketone more than a polyarylene sulfide.

2. The method as claimed in claim 1, wherein said solvent is selected from the group consisting of at least 90% by weight or higher concentrated sulfuric acid, methanesulfonic acid, trifluoromethanesulfonic acid, and trichloromethanesulfonic acid.

3. The method for metallizing a resin molded article which comprises the step of contacting a resin molded article at least the surface portion of which to be roughened mainly comprises a block copolymer comprising 100 parts by weight of a polyarylene sulfide component block and from 100 to 200 parts by weight of a polyarylene sulfide ketone component block with a solvent capable of dissolving a polyarylene sulfide ketone more than a polyarylene sulfide and then metallizing the roughened surface.

4. The method as claimed in claim 1, wherein said solvent is selected from the group consisting of at least 95% by weight concentrated sulfuric acid, methanesulfonic acid, trifluoromethanesulfonic acid, and trichloromethanesulfonic acid.

5. The method as claimed in claim 1, wherein the block copolymer comprises from 120 to 180 parts by weight of the polyarylene sulfide ketone component block per 100 parts by weight of the polyarylene sulfide component block.

6. The method as claimed in claim 1, wherein the block copolymer comprises from 130 to 170 parts by weight of the polyarylene sulfide ketone component block per 100 parts by weight of the polyarylene sulfide component block.

7. The method as claimed in claim 3, wherein the block copolymer comprises from 120 to 180 parts by weight of the polyarylene sulfide ketone component block per 100 parts by weight of the polyarylene sulfide component block.

8. The method as claimed in claim 3, wherein the block copolymer comprises from 130 to 170 parts by weight of the polyarylene sulfide ketone component block per 100 parts by weight of the polyarylene sulfide component block.

* * * * *